United States Patent [19]
Walden et al.

[11] Patent Number: 5,198,817
[45] Date of Patent: Mar. 30, 1993

[54] HIGH-ORDER SIGMA-DELTA ANALOG-TO-DIGITAL CONVERTER

[75] Inventors: Robert H. Walden, Newbury Park; Gabor C. Temes, Los Angeles, both of Calif.; Tanju Cataltepe, Red Bank, N.J.

[73] Assignee: Hughes Aircraft Company, Los Angeles, Calif.

[21] Appl. No.: 514,988

[22] Filed: Apr. 26, 1990

[51] Int. Cl.$^5$ .................... H03M 7/32; H03M 1/50
[52] U.S. Cl. ................................ 341/143; 341/166
[58] Field of Search ............... 341/166, 143; 375/33, 375/28; 307/520, 521, 491

[56] References Cited

U.S. PATENT DOCUMENTS

| | | | |
|---|---|---|---|
| 4,672,361 | 6/1987 | Kokubo et al. | 341/166 X |
| 4,837,527 | 6/1989 | Sauer | 341/167 X |
| 4,857,928 | 8/1989 | Gailus et al. | 341/143 |
| 4,860,012 | 8/1989 | Rich et al. | 341/143 |
| 4,926,178 | 5/1990 | Mallinson | 341/143 |

OTHER PUBLICATIONS

"Design and Implementation of an Audio 18-Bit Analog-to-Digital Converter Using Oversampling Techniques*", R. W. Adams. J. Audio Eng. Soc., vol. 34, No. 3, Mar. 1986, pp. 153-166.

"Improved Signal-to-Noise Ratio Using Tri-level Delta-Sigma Modulation", J. J. Paulos et al, 1987 IEEE, pp. 463-466, CH2394-5/87/0000-0463.

"A 16-bit Oversampling A-to-D Conversion Technology Using Triple-Integration Noise Shaping", Y. Matsuya et al, IEEE J. of Solid-State Circuits, vol. SC22, No. 6, Dec. 1987 pp. 921-929.

"VLSI—A to D and D to A Converters with Multi-Stage Noise Shaping Modulators", K. Uchimura et al., 1986 IEEE, ICASSP 86, pp. 1545-1548, ICASSP 86, Tokyo.

T. Cataltepe, et al., "Digitally Corrected Multi-Bit $\Sigma\Delta$ Data Converters", ISCAS 1989, 1989 IEEE, pp. 647-650.

Primary Examiner—Sharon D. Logan
Attorney, Agent, or Firm—V. D. Duraiswamy; W. K. Denson-Low

[57] ABSTRACT

A precision sigma-delta analog-to-digital converter disposed to operate at a sampling rate giving rise to a relatively low oversampling ratio is disclosed herein. The high-order sigma-delta analog-to-digital converter (10) of the present invention is operative to convert an analog input signal to a digital output sequence. The inventive converter (10) includes a first integrating network (14) for generating a first sampled analog signal ($X_1$) in response to the analog input signal. A second integrating network (18) generates a second sampled analog signal ($X_2$) in response to the first sampled analog signal ($X_1$). A third integrating network (22) generates a third sampled analog signal ($X_3$) in response to the second sampled analog signal ($X_2$). The sigma-delta converter (10) of the present invention further includes an internal quantizer (24) for generating the digital output sequence in response to the third sampled analog signal. A feedback network (28, 30) supplies the first, second and integrating networks (14, 18 and 22) with an analog feedback signal generated in response to the digital output sequence.

8 Claims, 3 Drawing Sheets

HIGH-ORDER SIGMA-DELTA ANALOG-TO-DIGITAL CONVERTER

The Government has rights in this invention pursuant to Contract N66001-86-C-0193 awarded by the Department of the Navy.

BACKGROUND OF THE INVENTION

1. Field of the Invention

This invention relates to analog-to-digital converters. More specifically, this invention relates to analog-to-digital converters employing sigma-delta modulation.

While the present invention is described herein with reference to a particular embodiment, it is understood that the invention is not limited thereto. Those having ordinary skill in the art and access to the teachings provided herein will recognize additional embodiments within the scope thereof.

2. Description of the Related Art

Recent developments in the field of digital signal processing, particularly within the areas of radar, digital radio and digital television, have accentuated the demand for fast, accurate analog-to-digital (A/D) converters. For analog-to-digital converters, accuracy may be gauged by measuring the signal-to-noise ratio of the output generated by the converter. The result is often expressed as resolution in terms of a particular number of bits. Typically, either a successive approximation or a dual-ramp conversion technique is used for high (i.e. 16-bit or greater) resolution A/D converters.

One difficulty with the successive approximation approach is that trimming a weighting network associated therewith is necessary to achieve a conversion accuracy in excess of 15 bits. The requirement of trimming inhibits production efficiency and increases unit costs.

High resolution is effected through the dual-ramp technique by utilizing, for example, precision high-speed integrator and sample-and-hold circuits. These circuits are generally realized only in certain specialized bipolar process technologies and then only with some difficulty.

Accordingly, A/D conversion techniques based on "oversampling" have been viewed favorably since this methodology obviates the need for trimming and for certain precision circuits. A/D converters utilizing oversampling operate at a clock rate much larger than the data rate of the sampled analog signal to be processed. The oversampling ratio of an A/D converter refers to the ratio of the clock rate of the A/D converter to the Nyquist sampling rate associated with the incident analog signal. As is well known, the value of the Nyquist rate is dependent upon the maximum frequency of interest included within the incident analog signal.

One class of oversampling A/D converters is based on a processing scheme known as sigma-delta modulation. Conventional sigma-delta modulators output a bit stream having a pulse density proportional to the amplitude of the applied input signal. In sigma-delta A/D converters the sigma-delta modulator is typically followed by a decimating digital low-pass filter. The digital filter produces a more conventional "digital word" representation of the analog input at a lower sampling rate than that of the modulator.

Unfortunately, the large oversampling ratios characterizing existing sigma-delta A/D converters limit the analog signal bandwidth which may be accurately processed by a single converter. As a consequence, conventional sigma-delta A/D converters have typically been constrained to applications involving, for example, audio signal processing. Further, the oversampling ratio is inversely proportional to the speed at which an analog signal may be converted to the digital domain. It follows that the large oversampling ratios of conventional sigma-delta A/D converters may preclude the inclusion of these converters in certain high speed processing applications. For example, a cascade of three first order sigma-delta modulators employing 1-bit quantization and oversampling ratios in excess of 64 to achieve 15 to 16 bit resolution are generally required.

Hence, a need exists in the art for a precision sigma-delta A/D converter capable of high-speed data conversion at a sampling rate allowing for a relatively low oversampling ratio.

SUMMARY OF THE INVENTION

The need in the art for a precision sigma-delta A/D converter capable of accurate conversion at a sampling rate resulting in a relatively low oversampling ratio is addressed by the high-order sigma-delta analog-to-digital converter of the present invention. The high-order A/D converter of the present invention is operative to convert an analog input signal to a digital output sequence. The inventive converter includes a first integrating network for generating a first sampled analog signal in response to the analog input signal. A second integrating network generates a second sampled analog signal in response to the first sampled analog signal. And a third integrating network generates a third sampled analog signal in response to the second sampled analog signal. The sigma-delta converter of the present invention further includes an internal quantizer for generating the digital output sequence in response to the third sampled analog signal. A feedback network supplies the first, second and third integrating networks with an analog feedback signal generated in response to the digital output sequence.

In a specific embodiment, additional integrating networks are added to make up a total of n integrating networks where n is the order of the $\Sigma\Delta$ converter.

DETAILED DESCRIPTION OF THE INVENTION

Figure 1:
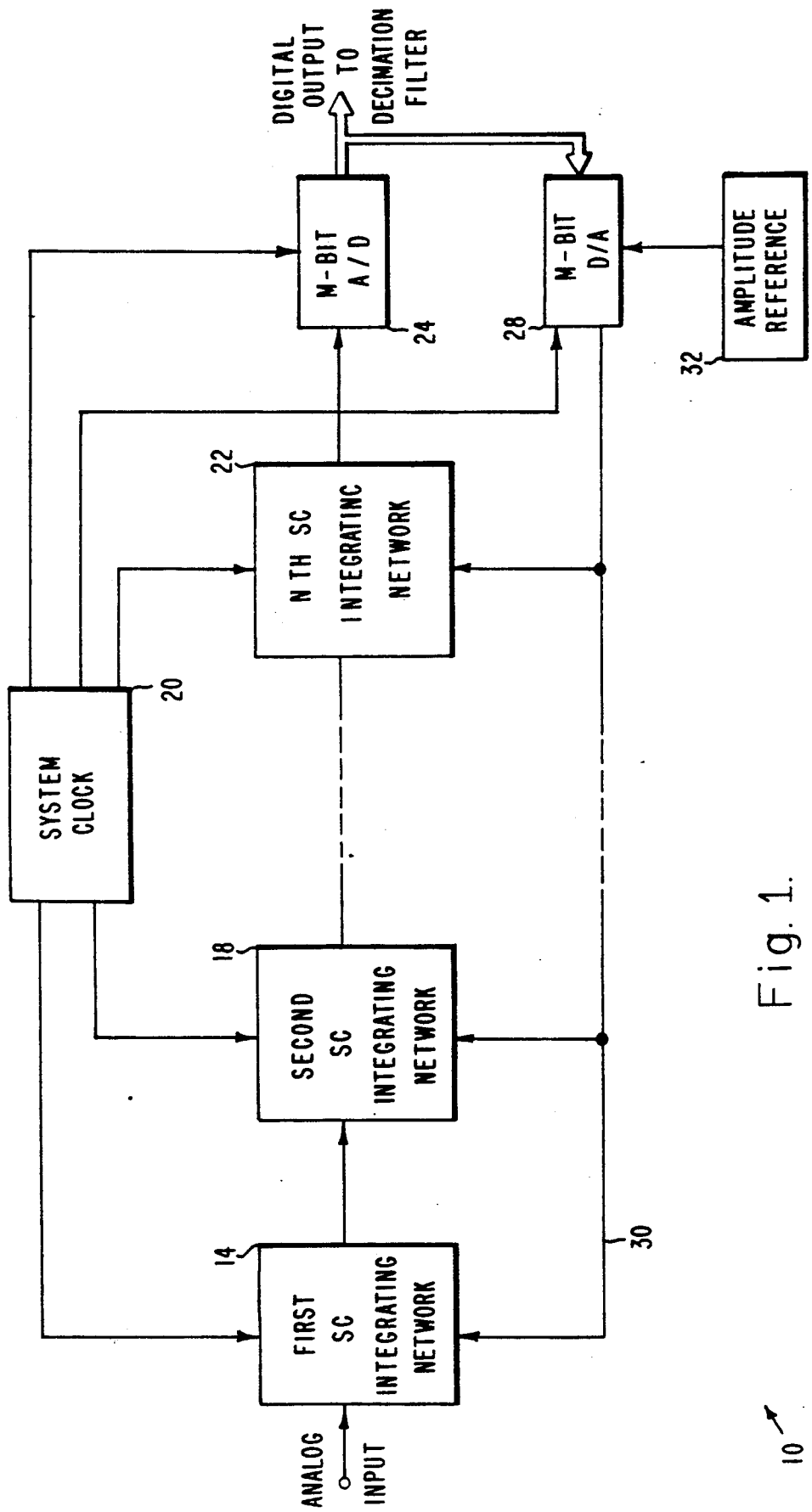
FIG. 1 is a block diagrammatic representation of the high-order sigma-delta analog-to-digital converter of the present invention.

FIG. 1 is a block diagrammatic representation of the high-order sigma-delta analog-to-digital converter 10 of the present invention. As will be described more fully below, the inventive converter 10 includes a first switched-capacitor (SC) integrating network 14 which is disposed to generate a first sequence of sampled analog signal values in response to an analog input signal. A second SC integrating network 18 is coupled to the first network 14 and is operative to produce a second sequence of sampled analog signal values. As shown in FIG. 1, the converter 10 includes "N" switched capacitor integrating networks connected to a system clock 20. The Nth SC integrating network 22 provides an Nth sampled analog sequence to an M-bit analog-to-digital (A/D) converter 24. When the A/D converter 24 is realized as a 1 bit A/D converter the digital output of the present invention comprises a serial bit stream without word boundaries, wherein each bit is of equal weight. Realizations of the converter 24 in which an Mth order A/D converter is employed result in an output of M-bit digital words. The digital data in both instances is output at the operative frequency of the system clock 20.

The digital output from the A/D converter 24 is monitored by an M-bit digital-to-analog (D/A) converter 28 included within a feedback path 30 of the inventive converter 10. The M-bit D/A converter 28 is operative to scale the voltage provided by an amplitude reference 32 in order to provide an analog feedback signal to the SC integrating networks 14, 18, 22. The D/A converter 28 is electrically connected to the system clock 20 and hence updates the value of the analog feedback signal at the clock rate thereof.

In a particular embodiment of the present invention, the digital output of the A/D converter is processed by a digital decimation filter (not shown) to obtain a filtered digital output in a more conventional (i.e. 16 bit) format compatible with standard data processing systems. Such a decimation filter receives digital output from the A/D converter 24 at the rate of the system clock 20 and produces an output at a lower sample rate. For example, if the digital decimation filter has a decimation ratio of 256 and produces 24 bits per word at its output, the data rate reduction would be 24/256. The digital decimation filter may be implemented through numerous well known structures. Two acceptable categories of filters include finite impulse response (FIR) and infinite impulse response (IIR) filters. The design of these filters is described in, for example, *Theory and Application of Digital Signal Processing* by Lawrence R. Rabiner and Bernard Gold, 1975 Prentice-Hall International, Inc.

Figure 2:
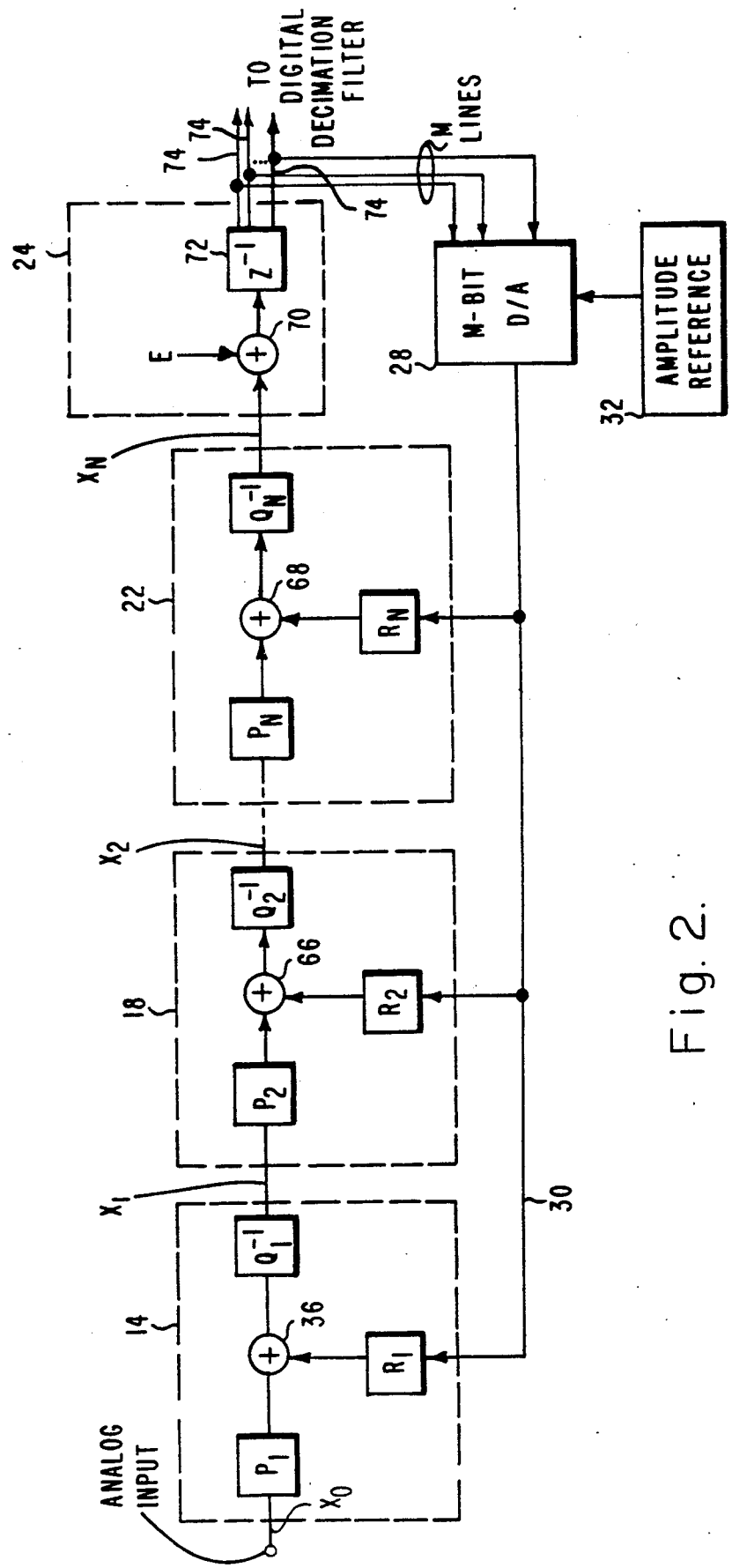
FIG. 2 shows a more detailed block diagrammatic representation of the sigma-delta A/D converter of the present invention wherein the system clock is not shown in order to enhance clarity.

FIG. 2 shows a more detailed block diagrammatic representation of the sigma-delta A/D converter 10 of the present invention, wherein the system clock 20 is not shown in order to enhance clarity. As shown in FIG. 2, the sampled analog voltages existing between the SC integrating networks are denoted by $X_0, X_1, X_2 \ldots X_n$. The first SC integrating network 14 includes a first input circuit block $P_1$, a first integrator block $Q_1^{-1}$ and a first feedback circuit block $R_1$. The outputs of the input and feedback blocks $P_1$, $R_1$ are combined at a summing node 36, which is coupled to the input of the integrator block $Q_1^{-1}$. In a preferred embodiment, the blocks $P_1$, $R_1$, $Q_1^{-1}$ include switched-capacitor circuit elements capable of being mathematically represented in discrete time by polynomials in $z^{-1}$.

Figure 3:
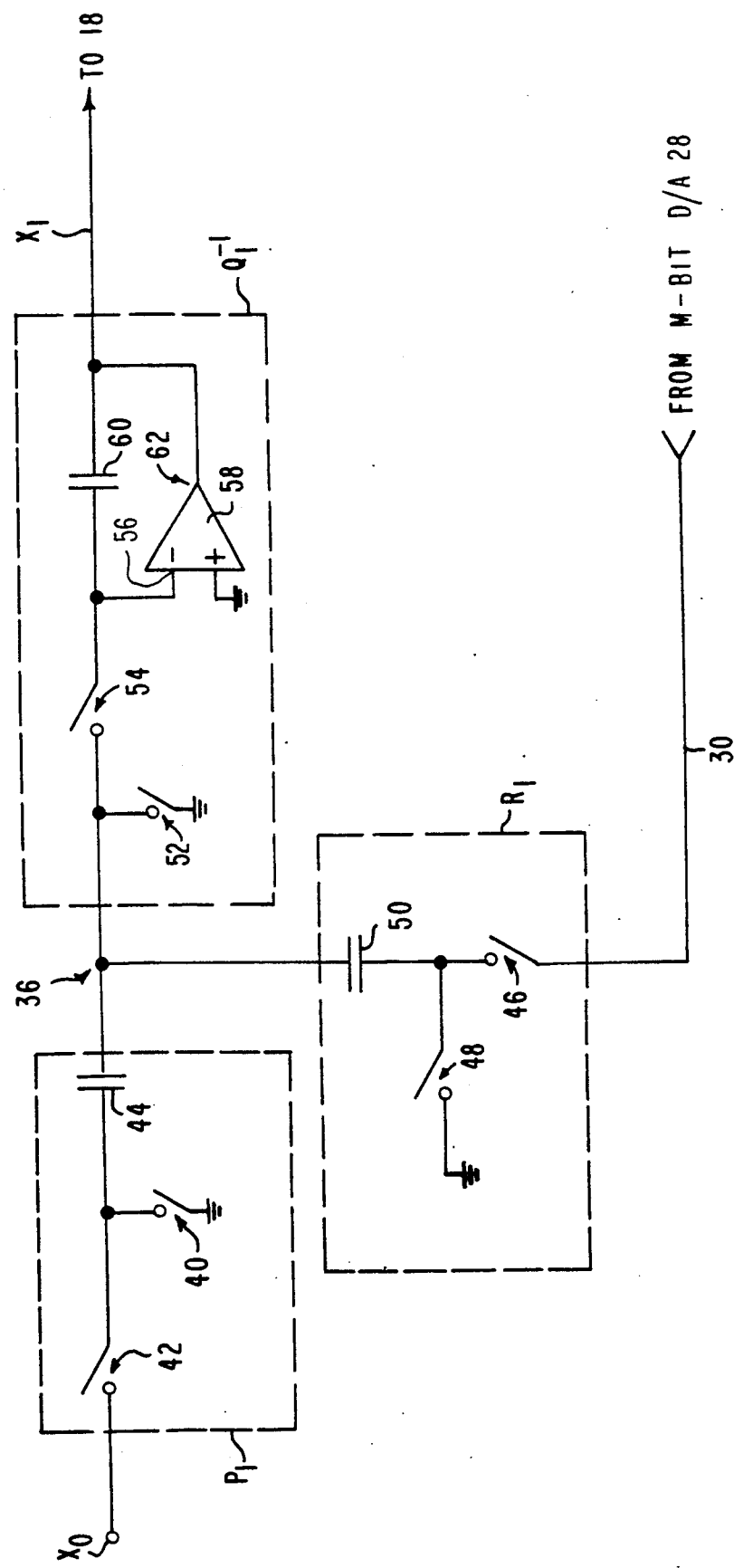
FIG. 3 is an illustrative representation of a particular switched capacitor realization of the first integrating network included within a preferred embodiment of the converter of the present invention.

A particular switched capacitor realization of the first SC integrating network 14 is shown in FIG. 3. As shown in FIG. 3, the first input circuit block $P_1$ includes first and second electronic switches 40, 42. The switches 40, 42 are typically realized by a CMOS or NMOS transmission gate. The first and second switches 40, 42 are both coupled to the system clock 20 (not shown) and are alternately actuated (closed) in response to a square wave therefrom. For example, the first switch 40 may be closed and the second switch 42 opened, in response to the high state of the square wave. The first and second switches are coupled to an input capacitor 44 having a value of $C^*p_1$, wherein * denotes multiplication, C is a nominal value of capacitance and $p_1$ is a capacitance coefficient which is assigned a value in a manner described below. The first feedback circuit block $R_1$ includes third and fourth alternately actuated switches 46, 48. The third and fourth switches 46, 48 are coupled to a feedback capacitor 50 having a value of $C^*r_1$, where again $r_1$ is a capacitance coefficient.

As shown in FIG. 3, the first integrator block $Q_1^{-1}$ includes fifth and sixth alternately actuated switches 52, 54. The fifth switch 52 is connect between the summing nod 36 and ground, while the sixth switch 54 links the summing node 36 with the inverting terminal 56 of an operational amplifier 58. An integrating capacitor 60 of value C is connected between the inverting terminal 56 and output terminal 62 of the operational amplifier 58. The value at the output terminal 62 of the operational amplifier 58 defines the value of the sampled analog voltage $X_1$.

Returning to FIG. 2, the second SC integrating network 18 includes a second input circuit block $P_2$, a second integrator block $Q_2^{-1}$ and a second feedback circuit block $R_2$. The outputs of the input and feedback blocks $P_2$, $R_2$ are combined at a second summing node 66, which is coupled to the input of the integrator block $Q_2^{-1}$. The blocks $P_2$, $R_2$, $Q_2^{-1}$ include switched-capacitor circuit elements substantially similar to those described above with reference to the circuit blocks $P_1$, $R_1$ and $Q_1^{-1}$, with the exception that the values of the capacitors within the blocks $P_2$ and $R_2$ are $C^*p_2$ and $C^*r_2$. Again, $p_2$ and $r_2$ are capacitor coefficients having magnitudes derived below.

The Nth integrating network 22 includes an Nth input circuit block $P_N$, an Nth integrator block $Q_N^{-1}$ and an Nth feedback circuit block $R_N$. The outputs of the input and feedback blocks $P_N$, $R_N$ are combined at an Nth summing node 68, which is coupled to the input of the integrator block $Q_N^{-1}$. In the embodiment of FIG. 2 the blocks $P_N$, $R_N$, $Q_N^{-1}$ include switched-capacitor circuit elements substantially similar to those described above with reference to the circuit blocks $P_1$, $R_1$ and $Q_1^{-1}$, again with the exception that the values of the capacitors within the blocks $P_N$ and $R_N$ are $C^*p_N$ and $C^*r_N$.

As shown in FIG. 2, the quantization noise generated by the M-bit A/D converter 24 is modeled as a noise source E. The quantization noise E is added to the Nth sampled analog sequence from the Nth integrating network 22 at an A/D summing node 70. The one clock cycle delay through the A/D converter 24 is represented by a delay element 72. The A/D converter 24 is operative to impress an M-bit digital word during each clock cycle upon M output lines 74.

As mentioned above, the $P_i$, $Q_i$ and $R_i$ switched-capacitor circuit blocks within each SC integrating network may be represented as a polynominal in $z^{-1}$. In particular, the representation in FIG. 2 of the converter 10 may be defined by the matrix equation:

$$A'X = z^{-1}R'E + PX_0 \tag{1}$$

where
$$X = [X_1, X_2, \ldots X_n]^T \tag{2}$$

$$R' = [R_1, R_2, \ldots R_n]^T \tag{3}$$

$$P = [P_1, 0, \ldots 0]^T \quad [4]$$

and, $$A' = \begin{bmatrix} Q_1 & 0 & 0 & \ldots & \ldots & -z^{-1}R_1 \\ -P_2 & Q_2 & 0 & \ldots & \ldots & -z^{-1}R_2 \\ 0 & -P_3 & Q_3 & 0 & \ldots & -z^{-1}R_3 \\ & & 0 & & & \\ \cdot & \cdot & & \cdots & & \cdot \\ \cdot & \cdot & & \cdots & & \cdot \\ 0 & 0 & 0 & \ldots & -P_n & (Q_n - z^{-1}R_n) \end{bmatrix} \quad [5]$$

with E denoting the quantization error associated with the A/D converter 24. The digital output Y(z) of the inventive converter 10 appearing on the output lines 74 can be expressed as:

$$Y(z) = \left[ 1/D(z) \prod_{j=1}^{n} P_j \right] ^{-1} X_o + \left[ 1/D(z) \prod_{j=1}^{n} Q_j \right] z^{-1} E \quad [6]$$

where D, the determinant of the matrix $A'$, is given by $$D(z) = \det(A') = \left[ \prod_{j=1}^{n} Q_j \right] -$$

$$z^{-1} \sum_{l=1}^{n} \left[ \prod_{j=1}^{l-1} Q_j \right] R_l \left[ \prod_{i=l+1}^{n} P_i \right] \quad [7]$$

The stability of the inventive converter 10 is determined by the roots of D(z). The system designer chooses a pole pattern which gives a stable response. The desired stable pole pattern can be described as the following polynomial, $$D(z) = 1 + \sum_{m=1}^{n} b_m z^{-m} \quad [8]$$

Then, the following n equations can be solved for $a_k$:

$$\sum_{k=n-m+1}^{n} \left[ \begin{matrix} k-1 \\ k-1-n+m \end{matrix} \right] (-1)^{k-1} a_k = \quad [9]$$

$$\left[ (-1)^n (-1)^m b_m - \binom{n}{m} \right]$$

where m = 1, ..., n.
Using the values of $a_k$ obtained from equation [9], the values of the capacitor coefficients $r_i$, $p_i$ where i = 1, ..., n, are given by:

$$a_s = \begin{cases} r_s \prod_{i=l+1}^{n} p_i, & s = 1, \ldots n-1 \\ r_n, & s = n \end{cases} \quad [10]$$

There are n equations with 2n unknowns (capacitor ratios) therefore n of the capacitor ratios can be arbitrarily assigned values and not disturb system stability. The extra capacitor ratio can be used to optimize the internal circuit performance, e.g., to avoid saturation in the integrating stages. Or, if this optimization is unnecessary, then the assignment $R_i = P_i = k_i$, for i = 1, 2, 3, ..., n, can be made. As an example, Table I shows $k_i$ values for stable high-order ΣΔ converters up to the fifth order for D(z) = 1. (Note that multibit quantizers should be used for these structures.)

TABLE I

| order | $k_1$ | $k_2$ | $k_3$ | $k_4$ | $k_5$ |
| --- | --- | --- | --- | --- | --- |
| 1 | 1 | | | | |
| 2 | 1/2 | 2 | | | |
| 3 | 1/3 | 1 | 3 | | |
| 4 | 1/4 | 2/3 | 3/2 | 4 | |
| 5 | 1/5 | 1/2 | 1 | 2 | 5 |

Accordingly, the teachings of the present invention enable design of a stable high-order (order ≧3) sigma-delta analog-to-digital converter. It has heretofore been necessary to cascade several independent first-order sigma-delta converters in order to effectuate precision analog-to-digital conversion without risking system instability. The novel approach of the present invention employs multiple feedback paths (i.e. between the D/A converter 28 and the summing nodes 36, 66, 68) and multi-bit internal quantization in order to provide a stable, single stage A/D sigma-delta converter—thus obviating the need for cascading independent lower order stages. Since each stage in such a conventional cascaded system incorporates a separate internal quantizer and D/A converter, it is apparent that the inventive high-order single stage approach avoids circuit duplication.

As mentioned in the Background of the Invention, conventional sigma-delta A/D converters typically require oversampling ratios in excess of sixty-four to achieve fifteen to sixteen bit resolution. In contrast, an embodiment of the present invention utilizing four switched capacitor integrating networks (N=4) and a five bit A/D converter 24 can achieve sixteen to seventeen bit resolution while being operative at an oversampling ratio of only sixteen. One benefit accruing to the inventive A/D sigma-delta converter 10, as a consequence of operation characterized by a reduced oversampling ratio, is the capability to process broader bandwidth analog input signals. While existing sigma-delta converters have been utilized in relatively narrow-band audio applications, existing sigma-delta converters have typically not been included in wider bandwidth video systems. Moreover, for a desired level of resolution a lower oversampling ratio allows higher analog-to-digital conversion rates for a given semiconductor technology.

The high-order converter 10 of the present invention can be physically realized from discrete components, but may also be readily fabricated as an integrated circuit (IC). Inspection of FIGS. 2 and 3 reveals that with the exception of the operational amplifiers within the integrating networks, the inventive converter 10 is predominantly comprised of digital elements. The ease with which digital architectures may be implemented as integrated circuits in a variety of semiconductor technologies is well-known.

Thus the present invention has been described with reference to a particular embodiment in connection with a particular application. Those having ordinary skill in the art and access to the teachings of the present invention will recognize additional modifications and applications within the scope thereof. For example, the circuit blocks $P_i$, $Q_i$ and $R_i$ within the integrating networks may be realized by circuit topologies other than the particular switched-capacitor integrating network described herein without departing from the scope of the present invention. Similarly, the invention is not limited to a particular scale of internal quantization—although preferred embodiments of the present invention will typically employ internal quantizers of one to five bits. Further, although a digital decimation filter will generally be utilized to translate the digital output from the present invention into a somewhat more conventional sixteen bit format, the inventive converter nonetheless effects conversion of the input analog signal into the digital domain independent of such a filter. It is therefore contemplated by the appended claims to cover any and all such modifications.

Accordingly,

What is claimed is:

1. An analog-to-digital converter for converting an analog input signal to a stable digital output sequence, comprising:

first integrating network means for generating a first sampled analog signal in response to said analog input signal;

second integrating network means for generating a second sampled analog signal in response to said first sampled analog signal;

third integrating network means for generating a third sampled analog signal in response to said second sampled analog signal;

multibit quantizer means for generating said stable digital output sequence in response to said third sampled analog signal; and feedback means operatively coupled to said first, second and third integrating network means for generating an analog feedback signal from said stable digital output sequence, wherein said second integrating network is coupled to said first integrating network and said third integrating network is coupled to said second integrating network and each of said first, second and third integrating network means includes a switched capacitor input element, a switched capacitor feedback element, and a switched capacitor integrator element, said switched capacitor input element and said switched capacitor feedback element are each operatively coupled to said switched capacitor integrator element, capacitive ratios, respectively, of said switched capacitor input element to said switched capacitor integrator element and of said switched capacitor feedback element to said switched capacitor integrator element being selected to provide a pole pattern having said stable digital output sequence.

2. The analog-to-digital converter to claim 1 wherein said capacitive ratios of said analog-to-digital converter are in accordance with roots of an expression in a z domain for a determinant of a matrix defining said integrating network means which is equal to a constant plus a summation having limits of from one to "n" of a first variable defining the pole pattern of said analog-to-digital converter and a second variable defining a polynominal in the z domain.

3. The analog-to-digital converter to claim 1 wherein said converter is a stable high order sigma-delta analog-to-digital converter.

4. The analog-to-digital converter of claim 3 wherein said sigma-delta analog-to-digital converter has an order greater than or equal to three.

5. The analog-to-digital converter to claim 1 wherein said feedback means comprises a digital-to-analog converter.

6. A method for designing an analog-to-digital converter for converting an analog input signal to a stable digital output sequence, said method comprising the steps of:

providing a first integrating network for generating a first sampled analog signal in response to said analog input signal;

providing a second integrating network for generating a second sampled analog signal in response to said first sampled analog signal;

providing a third integrating network for generating a third sampled analog signal in response to said second sampled analog signal;

wherein each of said first, second and third integrating networks includes a switched capacitor input element, a switched capacitor feedback element, and a switched capacitor integrator element;

providing a multiple quantizer for generating said stable digital output sequence in response to said third sampled analog signal;

providing a feedback circuit operatively coupled to said first, second and third integrating networks for generating an analog feedback signal from said stable digital output sequence; and selecting a capacitor coefficient for each of said switched capacitor input element, switched capacitor feedback element, and switched capacitor integrator element such that capacitive ratios, respectively, of said switched capacitor input element to said switched capacitor integrator element and of said switched capacitor feedback element to said switched capacitor integrator element provides a pole pattern having said stable digital output sequence.

7. The method of designing an analog-to-digital converter of claim 6 further including the step of determining said capacitive ratios of said analog-to-digital converter in accordance with roots of an expression in a z domain for a determinant of a matrix defining said integrating networks which is equal to a constant plus a summation having limits of from one to "n" of a first variable defining the pole pattern of said analog-to-digital converter and a second variable defining a polynomial in the z domain.

8. An analog-to-digital converter for converting an analog input signal to a stable digital output sequence, comprising:

a plurality of N integrating network means, where N is an integer having a value from 2 to N, for generating sampled analog signals, coupled to each other such that a first integrating network means of said plurality generates a sampled analog signal in response to said analog input signal and successive integrating network means each generate a sampled analog signal in response to a sampled analog signal from the preceding integrating network means, multibit quantizer means for generating said stable digital output sequence in response to a sampled analog signal from the Nth integrating network means, and feedback means operatively coupled to said plurality of integrating network means for generating an analog feedback signal from said stable digital output sequence, wherein each of said plurality of integrating network means includes a switched capacitor input element, a switched capacitor feedback element, and a switched capacitor integrator element, and said switched capacitor input element and said switched capacitor feedback element are each operatively coupled to said switched capacitor integrator element, and capactive ratios, respectively, of said switched capacitor input element to said switched capacitor integrator element and of said switched capacitor feedback element to said switched capacitor integrator element are selected to provide a pole pattern having said stable digital output sequence.

* * * * *